United States Patent [19]

Yamamoto

[11] 4,281,399

[45] Jul. 28, 1981

[54] SEMICONDUCTOR MEMORY DEVICE

[75] Inventor: Shin'ichiro Yamamoto, Yokohama, Japan

[73] Assignee: VLSI Technology Research Association, Japan

[21] Appl. No.: 59,127

[22] Filed: Jul. 20, 1979

[30] Foreign Application Priority Data

Jul. 25, 1978 [JP] Japan .................................. 53-90609

[51] Int. Cl.³ .............................................. G11C 11/40
[52] U.S. Cl. ..................................... 365/203; 365/174; 307/238.8
[58] Field of Search ............... 365/174, 189, 200, 203; 307/238, 279

[56] References Cited

U.S. PATENT DOCUMENTS 3,801,964   4/1974   Palfi et al. ............................ 365/174

OTHER PUBLICATIONS

IEEE Journal of Solid-State Circuits, vol. SC-7, No. 3, Jun. 1972, pp. 217-224, "Eliminating Threshold Losses in MOS Circuits by Bootstrapping Using Varactor Coupling" by Reuben & Joynson et al.

Primary Examiner—Terrell W. Fears
Attorney, Agent, or Firm—Finnegan, Henderson, Farabow, Garrett & Dunner

[57] ABSTRACT

Disclosure is a semiconductor memory device comprising a memory cell array having a plurality of memory cells arranged in a matrix fashion each formed of a field effect transistor and a capacitor, a plurality of word lines each connected commonly to the gates of those field effect transistors which are arranged on an identical column of the memory cell array, a plurality of digit lines each connected commonly to the drains of those field effect transistors which are arranged on an identical row of the memory cell array, and a plurality of decoder circuits for selectively activating the word lines. In the memory device, the decoder circuit produces an output signal to drive the word line to a voltage level higher than a voltage level appearing on the activated digit line.

12 Claims, 8 Drawing Figures

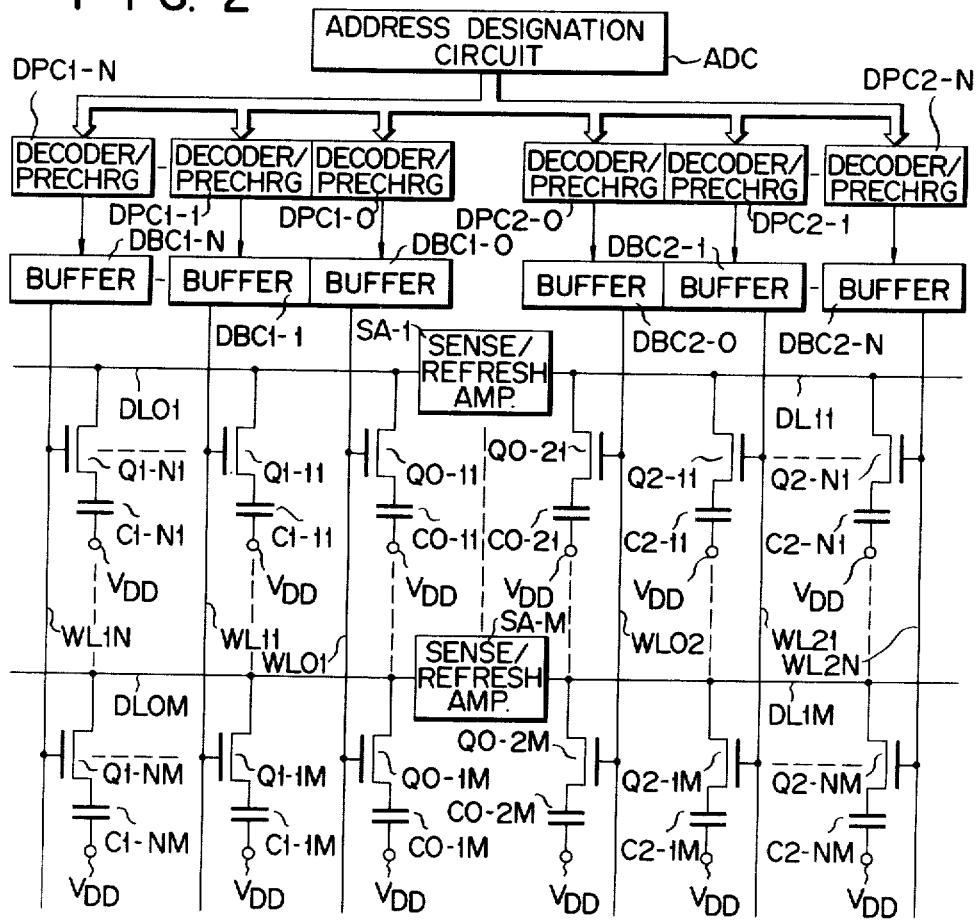
F I G. 2

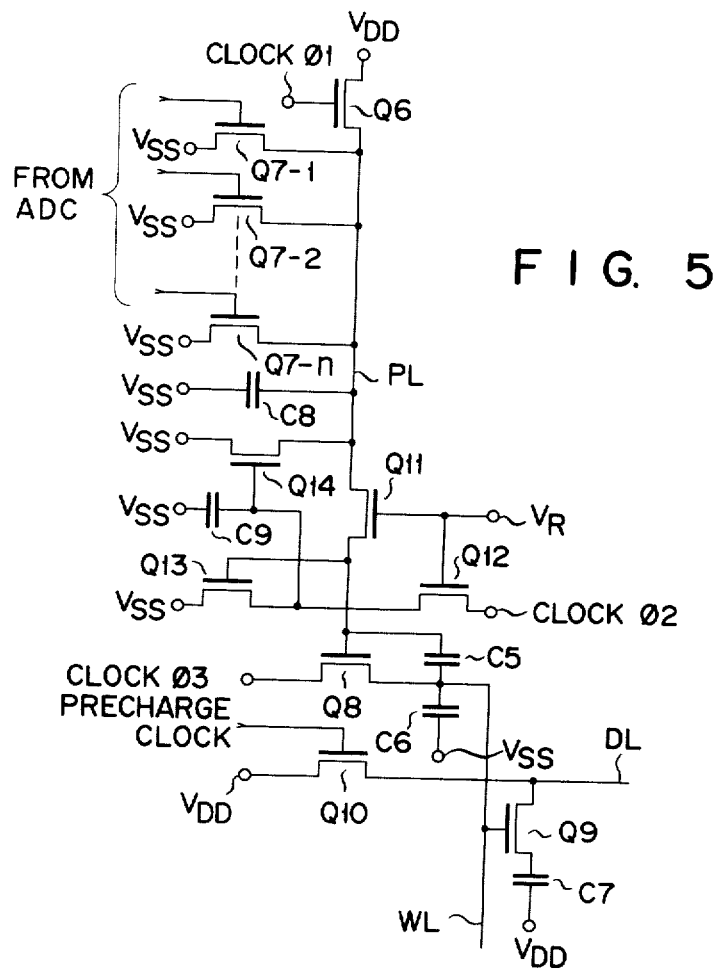

SEMICONDUCTOR MEMORY DEVICE

BACKGROUND OF THE INVENTION

The present invention relates to a semiconductor memory device with field effect transistors.

Recently, the degree of integration of integrated circuits has been rapidly improved. Particularly, in semiconductor memories, the degree of integration has been increased by two times every year and, in the near future, a semiconductor memory of several megabits per chip will be realized. In realizing such a semiconductor memory with a high degree of integration, it is essential to develop a precise manufacturing technique to effectively use dynamic memory cells each formed of one transistor and one capacitor and to precisely set the distance between the source and the drain of the transistor to be 1μ, for example. The miniaturization of the transistor to form a dynamic memory cell necessitates the lowering of a power source voltage used. With the lowering of the power source voltage used, the amount of charge stored representing data to be written into a memory cell decreases so that the value of a signal voltage also decreases. It is very difficult to design a sense amplifier capable of reliably sensing such a low voltage which also permits sufficiently long refresh intervals.

FIG. 1 shows a basic circuit of a conventional dynamic memory including a memory cell formed of a single transistor and a single capacitor. In FIG. 1, a field effect transistor (FET) Q1 and a capacitor C1 cooperate to form a memory cell and a field effect transistor Q0 and a capacitor C0 cooperate to form a dummy cell. The FET's Q0 and Q1 are connected at their gates to word lines WL1 and WL2, respectively. These word lines WL1 and WL2 are connected to receive clock pulses $\phi$ through current paths of FET's Q2 and Q3, respectively, which receive at their drains clock pulses generated from a decoder circuit (not shown). The drains of the transistors Q0 and Q1 are respectively connected to corresponding terminals of a sense/refresh amplifier SA, through digit lines DL0 and DL1. These digit lines DL0 and DL1 are parasitically connected with stray capacities C2 and C3, respectively. These digital lines DL0 and DL1 are further connected to power source terminals $V_{DD}$ through current paths of FET's Q4 and Q5, respectively.

In FIG. 1, when the word line WL2 is energized by a clock pulse supplied from a word line selection circuit (not shown) through the FET Q3, the dummy cell applies a reference voltage to the sense/refresh amplifier SA through the digit line DL1. The sense/refresh amplifier SA supplies to an output circuit (not shown) an output signal corresponding to a difference between a signal voltage and a reference voltage coming from the memory cell and the dummy cell by way of the digit lines DL0 and DL1, respectively.

Assume now that data is loaded into the memory cell with a voltage Vw and, after a given time lapses, the word lines WL1 and WL2 are energized for reading out the data stored in the memory cell. At this time, the signal voltage Vs at each terminal of the sense/refresh amplifier SA is given $$V_s = \frac{1}{2}(V_w - V_{DROP}) \times \frac{1}{1 + \frac{C2}{C1}}$$

where $V_{DROP}$ is the amount by which the data voltage is attenuated within the memory cell during a time period from the write of data to the read of data.

The data voltage Vw loaded into the memory cell is lower than the power source voltage $V_{DD}$ by the threshold voltage $V_{TH}$ of the FET Q1. This is for the following reason. In the circuit shown in FIG. 1, for example, the digit line DL0 is held at most at the potential of $V_{DD}$ and the word line WL1 is held at the maximum voltage of $V_{DD}$ when it is energized. In other words, when the digit line DL0 and the word line WL1 are kept at the potential of $V_{DD}$, the field effect transistor Q1 operates in a pentode mode so that the charged voltage across the capacitor C1 is suppressed below ($V_{DD} - V_{TH}$).

When 12 V, for example, is used for the power source voltage, the write voltage is approximately 10 V. In a very large scale integrated memory device, the distance between the source and drain of the field effect transistor forming each memory cell is chosen to be 1 to 2μ, for example, and the power source voltage $V_{DD}$ is set to a low voltage, for example, 2 to 5 V. In this case, in order to reliably operate the field effect transistor, the threshold voltage $V_{TH}$ of the FET must be set to be 0.4 to 0.5 V or more. Accordingly, in order to write data into the memory cell in the above-mentioned manner, the utilization efficiency of the power source voltage is poor so that the write voltage is very low. This leads to the narrowing of the design and operation margins of the memory cell.

SUMMARY OF THE INVENTION

Accordingly, an object of the invention is to provide a semiconductor memory device of which the write operation may be executed by a voltage equal to a power source voltage used.

According to one aspect of the invention, there is provided a semiconductor memory device comprising a memory cell including a single field effect transistor and a capacitor, a word line connected to the gate terminal of the single field of effect transistor, a digit line connected to one of the source and drain terminals of the single field effect transistor and also to a power source terminal thereby to be selectively energized to a power source voltage level, and an energizing circuit for energizing the word line by a higher voltage level than the power source voltage level.

Other objects and features of the invention will be apparent from the following description taken in conjunction with the accompanying drawings, in which:

BRIEF DESCRIPTION OF THE DRAWINGS

FIG. 2 is a circuit diagram of semiconductor memory device of an embodiment according to the invention;

FIG. 5 is a circuit diagram of a modification of the circuit shown in FIG. 4; and FIGS. 6A to 6C show the waveforms of clock pulses used for driving the circuit shown in FIG. 5.

DETAILED DESCRIPTION OF THE PREFERRED EMBODIMENTS

Reference is first made to FIG. 2 illustrating a semiconductor memory device of an embodiment according to the invention. The semiconductor memory device is constituted by a first matrix array including a plurality of memory cells each having a single FET Q1 and a single capacitor C1, a second matrix array including a plurality of memory cells each having a single FET Q2 and a capacitor C2, and a plurality of differential type sense/refresh amplifiers SA-1 to SA-M. The drain terminals of FET's Q1-1i to Q1-Ni (i is a number included in 1 to M) partly forming memory cells arranged on the same row of the first matrix array, are commonly connected to a digit line DL0i. Similarly, the drain terminals of FET's Q2-1i to Q2-Ni partly forming memory cells arranged on the same row of the second matrix array, are commonly connected to a digit line DL1i. The digit lines DL0i and DL1i are connected to the differential input terminals of the sense/refresh amplifier SA-i, respectively. The gates of FET's Q1-j1 to Q1-jM (j is a number included in 1 to N) partly forming memory cells arranged on the same column of the first matrix array, are commonly connected to a word line WL1j. The gates of FET's Q2-j1 to Q2-jM partly forming memory cells arranged on the same column of the second matrix array are commonly connected to a word line WL2i. Further connected to the digit lines DL0i to DL0M are the drains of FET's Q0-11 to Q0-1M forming dummy cells in cooperation with capacitors C0-11 to C0-1M. Connected to the digit lines DL11 to DL1M are the drains of FET's Q0-21 to Q0-2M forming dummy cells in cooperation with capacitors C0-21 to C0-2M. The gates of the FET's Q0-11 to Q0-1M are connected commonly to the word line WL01 while the gates of the FET's Q0-21 to Q0-2M commonly to the word line WL02.

The word lines WL01, WL11 to WL1N respectively are connected through decoding buffer circuits DBC1-0, DBC1-1 to DBC1-N to decoder/precharge circuits DPC1-0, DPC1-1 to DPC1-N. The word lines WL02, WL21 to WL2N are connected through buffer circuits DBC2-0, DBC2-1 to DBC2-N to decoder/precharge circuits DPC1-0, DPC1-1 to DPC1-N. These decoder/precharge circuits receive a row selection signal from an address designation circuit ADC to selectively drive the word line.

Figure 1:
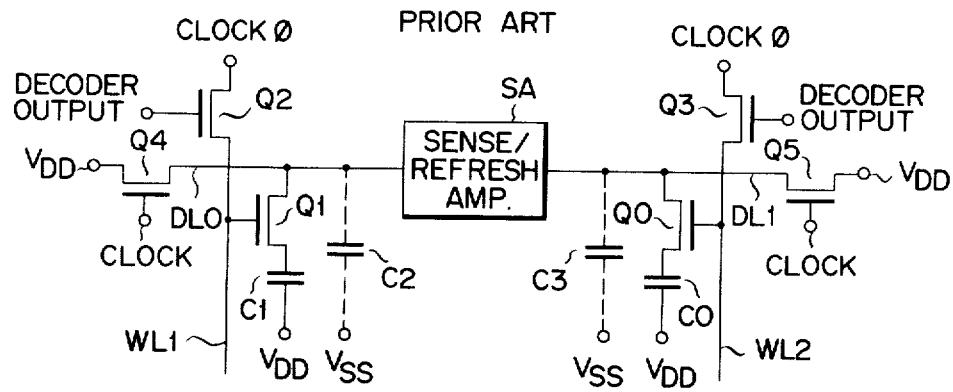
FIG. 1 shows a basic circuit of a conventional dynamic memory including a memory cell having a single transistor and a capacitor.
Figures 3, 4:
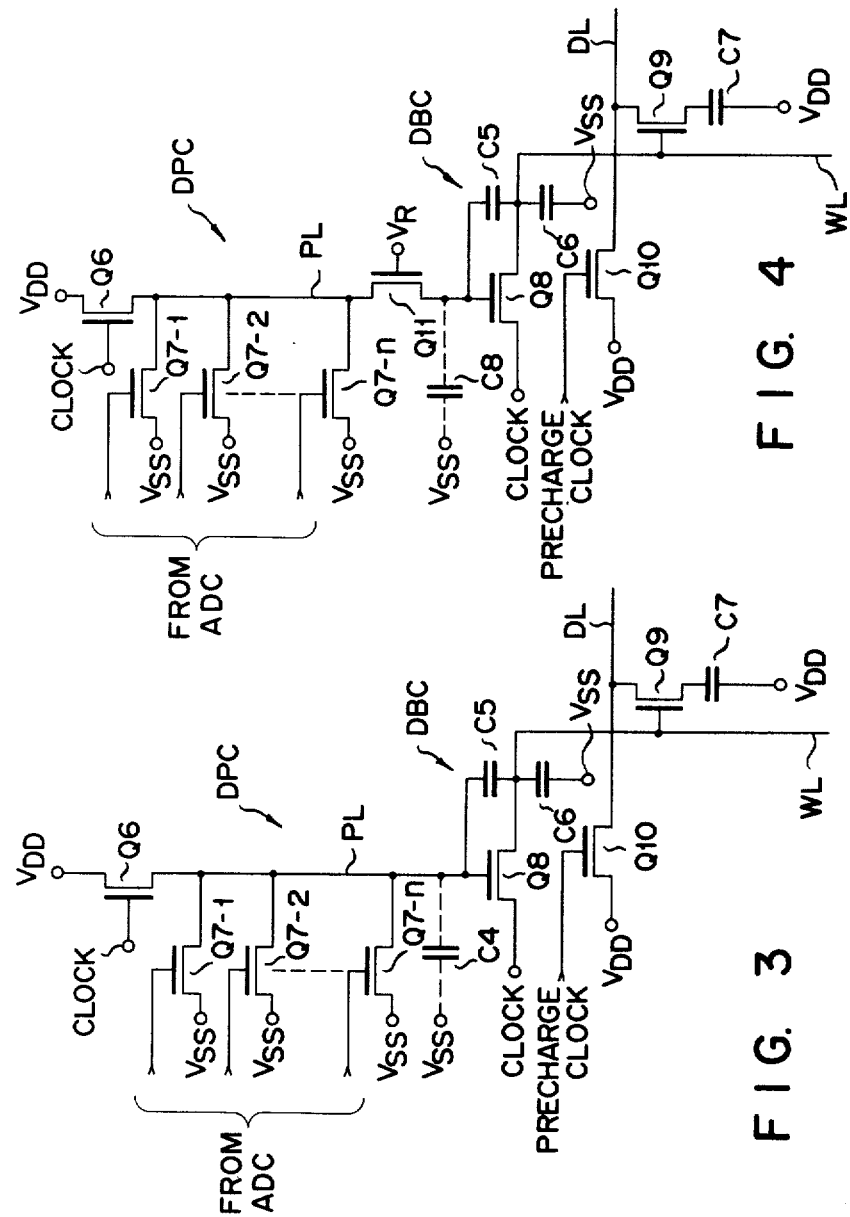
FIG. 3 is a circuit diagram of a decoder/precharge circuit and a decoding buffer circuit.
FIG. 4 is a circuit diagram of a modification of the circuit shown in FIG. 3.

Turning now to FIG. 3, there is shown a detailed circuit of the decoding buffer circuit DBC and the related decoder/precharge circuit DPC used in the semiconductor memory device shown in FIG. 2.

In the circuit shown in FIG. 3, the decoder/precharge circuit DPC is comprised of an FET Q6 which is connected at the drain to a power source terminal $V_{DD}$ and at the source to the precharge line PL, and receives at the gate a precharge clock pulse, and decoder FET's Q7-1 to Q7-n (in this example, n is an integer larger than 2) which are connected at the drains commonly to the precharge line PL, and at the sources to power source terminal Vss, and receive at the gates word line selection signals from the address designation circuit ADC. A stray capacitance C4 is developed between the precharge line PL and the power source terminal Vss. The decoding buffer circuit DBC is comprised of an FET Q8 which is connected at the gate to the precharge line and at the source to the word line WL, and receives at the drain a clock pulse, a boot-strap capacitor C5 coupled between the gate of the FET Q8 and the source of the same, and a capacitor C6 coupled between the capacitor C5 and the power source terminal Vss. The word line WL is connected to the gate of an FET Q9 forming a memory cell in cooperation with the capacitor C7. The digit line DL is connected to the drain of the FET Q9 and further to a power source terminal $V_{DD}$ through an FET Q10. The FET Q10 receives at the gate a precharge clock pulse to control the energization of the digit line DL.

It should be noted in the circuit in FIG. 3 that a clock pulse with a voltage equal to or larger than the power source voltage is applied to the gate of the FET Q6, and a voltage larger than the power source voltage $V_{DD}$ is applied to the drain of the FET Q8 and the gate of the FET Q10, and that the capacitances of the capacitors C5 and C6 are so chosen that, when the precharge line PL is energized, a voltage higher than the voltage applied to the drain of the FET Q8 appears at the gate of the FET Q8. For example, when a voltage $(V_{DD}+V_{TH}+\Delta V)$ ($\Delta V$ is a voltage margin) is applied to the drain of the FET Q8 to energize the precharge line PL, the capacitances of the capacitors C5 and C6 are so chosen that the gate voltage of the FET Q8 becomes $(V_{DD}+2V_{TH}+2\Delta V)$.

The operation of the semiconductor memory circuit shown in FIGS. 2 and 3 will be described.

A column selection signal and a row selection signal produced from the address designation circuit ADC cause all the FET's Q7-1 to Q7-n to be rendered nonconductive but the FET Q10 to be rendered conductive. In this case, since a voltage higher than the power source voltage $V_{DD}$ is applied to the gates of the FET's Q6 and Q10, the precharge line PL and the digit line DL are energized. Therefore, the gate voltage of the FET Q8 becomes $(V_{DD}+2V_{TH}+2\Delta V)$ and the FET Q8 executes a triode operation. As a result, a voltage equal to the drain voltage, i.e. the voltage $(V_{DD}+V_{TH}+\Delta V)$, appears at the source of the FET Q8. Accordingly, the word line WL is energized and held at the voltage $(V_{DD}+V_{TH}+\Delta V)$. At this time, the digit line DL0 is also activated and held at the voltage level $V_{DD}$, so that the FET Q9 operates in the triode mode with the result that a voltage equal to the drain voltage appears at the source of the FET Q9 and the capacitor C7 is charged. Thus, the circuit shown in FIG. 3 executes a write operation at a voltage equal to the power source voltage $V_{DD}$.

FIG. 4 is a circuit diagram of a modification of the circuit shown in FIG. 3. The circuit in FIG. 4 is similar to that in FIG. 3, except that an FET Q11 is used to selectively isolate the decoder/precharge circuit DPC from the decoding buffer circuit DBC. A voltage $V_R$ equal to or lower than a power source voltage $V_{DD}$ is applied to the gate of the FET Q11. When a clock pulse is applied to the gate of the FET Q8 and the source voltage of FET Q11 becomes higher than the drain voltage thereof owing to the bootstrap effect, then the FET Q11 becomes nonconductive. A stray capacitance C8 between the gate of the FET Q8 and the power source terminal Vss is smaller than the stray capacitance C4 in the circuit in FIG. 3. Therefore, the pull-up of the gate voltage of the FET Q8 is effected at a higher speed so that the circuit shown in FIG. 4 operates at a higher speed than the circuit shown in FIG. 3.

FIG. 5 shows a modification of the circuit shown in FIG. 4. The circuit shown in FIG. 5 is similar to that shown in FIG. 4 except that three more FET's Q12 to Q14 are used to achieve more reliable operation. The FET Q12 is connected to receive a voltage $V_R$ at the gate and a clock pulse $\phi 2$ at the drain. The source of the FET Q12 is connected to a capacitor C9, to the drain of the FET Q13 whose gate is connected to the source of the FET Q11, and also to the gate of the FET Q14 whose drain is connected to the drain of the FET Q11.

The operation of the circuit shown in FIG. 5 is explained with reference to FIGS. 6A to 6C which respectively show the waveforms of clock pulses $\phi 1$ to $\phi 3$.

Where the decoder circuit shown in FIG. 5 is selected, that is, all the FET's Q7-1 to Q7-n are rendered nonconductive and then a clock pulse $\phi 1$ applied to the gate of the FET Q6 is terminated at a timing T1 as shown in FIG. 6A, the precharge line PL is maintained at a high voltage level. Since, in this case, a high voltage is applied to the gate of the FET Q13 and renders the same conductive, a low voltage is applied to the gate of the FET Q14 even if a clock pulse $\phi 2$ is applied from a timing T2 until timing T3. During application of clock pulse $\phi 2$, a clock pulse $\phi 3$ is applied at timing T4 to drive a selected word line WL.

On the other hand, when the decoder circuit shown in FIG. 5 is not selected, at least one of the FET's Q7-1 to Q7-n is rendered conductive, potential on the precharge line becomes low. Since, in this case, a low voltage is applied to gate of the FET Q13 and renders the same nonconductive, a high voltage is applied to the gate of the FET Q14 when a clock pulse $\phi 2$ is applied so that potential on the precharge line is made low without fail. If, during application of clock pulse $\phi 2$, a clock pulse $\phi 3$ is applied, the FET Q8 is kept non-conductive. This ensures that non-selected word line is not erroneously driven.

What is claimed is:

1. A semiconductor memory device comprising:
a memory cell including a single field effect transistor and a single capacitor;
a word line connected to the gate terminal of the field effect transistor;
a digit line connected to one of the source and drain terminals of said field effect transistor and also to a power source terminal thereby to be selectively charged to a power source voltage level; and
means for writing data into the said capacitor of said memory cell at a voltage equal to said power source voltage level comprising an energizing circuit for energizing said word line to a higher voltage level than said power source voltage level when said digit line is energized to said power source voltage level.

2. A semiconductor memory device according to claim 1, wherein said energizing circuit includes a precharge line, a precharge circuit for selectively precharging the precharge line, and a buffer circuit connected to a second power source terminal and said precharge line to supply to said word line an output voltage corresponding to a voltage applied to said precharge line and said second power source terminal.

3. A semiconductor memory device according to claim 2, wherein said buffer circuit is a bootstrap circuit including a buffer field effect transistor connected at the gate to the precharge line and a capacitor connected between the gate terminal of the buffer field effect transistor and one of the drain and source terminals.

4. A semiconductor memory device according to claim 2 or 3, further comprising an isolation field effect transistor connected between said buffer circuit and said precharge line.

5. A semiconductor memory device according to claim 4, further comprising first and second field effect transistors whose current paths are serially connected and whose gates are respectively connected to the gate of said isolation field effect transistor and the gate of said buffer field effect transistor, and a third field effect transistor which is connected at one of the drain and source to said precharge line and at the gate to a junction between said first and second field effect transistors.

6. A semiconductor memory device according to claim 1, wherein said energizing circuit energizes the word line to a voltage level not lower than the sum of the power source voltage level and the threshold voltage of the field effect transistor of said memory cell.

7. A semiconductor memory device comprising:
memory cells each including a single field effect transistor and a single capacitor, and being arranged in a matrix fashion;
a plurality of word lines each connected to the gate terminals of those of said field effect transistors which are arranged on the same column;
a plurality of digit lines which are each connected commonly to one of the drain and source terminals of said field effect transistors arranged on the same row and are connected to a first power source terminal to be selectively charged to a power source voltage level; and
means for writing data into said capacitor of a selected one of said memory cells at a voltage equal to said power source voltage level comprising a plurality of energizing circuits which are each connected to a corresponding one of said word lines, and which energize a word line corresponding to said selected memory cell to a higher voltage level than said power source voltage level when a digit line corresponding to said selected memory cell is energized to said power source voltage level.

8. A semiconductor memory device according to claim 7, wherein said energizing circuits each include a precharge line, a precharge circuit for selectively precharging the precharge line, and a buffer circuit connected to a second power source terminal and said precharge line to supply to said word line an output voltage corresponding to a voltage applied to said precharge line and said second power source terminal.

9. A semiconductor memory device according to claim 8, wherein said buffer circuit is a bootstrap circuit including a buffer field effect transistor connected at the gate to the precharge line and a capacitor connected between the gate terminal of the buffer field effect transistor and one of the drain and source terminals.

10. A semiconductor memory device according to claim 8 or 9, further comprising an isolation field effect transistor connected between said buffer circuit and said precharge line.

11. A semiconductor memory device according to claim 10, further comprising first and second field effect transistors whose current paths are serially connected and whose gates are respectively connected to the gate of said isolation field effect transistor and the gate of said buffer field effect transistor, and a third field effect transistor which is connected at one of the drain and source to said precharge line and at the gate to a junction between said first and second field effect transistors.

12. A semiconductor memory device according to claim 7, wherein said energizing circuit energizes the word line to a voltage level not lower than the sum of the power source voltage level and the threshold voltage of the field effect transistor of said memory cell.

* * * * *